United States Patent
Yung et al.

(10) Patent No.: US 7,046,718 B1
(45) Date of Patent: May 16, 2006

(54) COHERENT PHASE SYNCHRONOUS CODE DIVISION MULTIPLE ACCESS COMMUNICATIONS FROM MULTIPLE TRANSPONDER PLATFORMS

(75) Inventors: Kar Yung, Torrance, CA (US); Frank A. Hagen, Palos Verdes Estates, CA (US); Ying Feria, Manhattan Beach, CA (US); Donald C. D. Chang, Thousand Oaks, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 1184 days.

(21) Appl. No.: 09/669,095

(22) Filed: Sep. 25, 2000

(51) Int. Cl.
*H04B 1/69* (2006.01)
*H03D 3/24* (2006.01)

(52) U.S. Cl. ...................... 375/145; 375/373

(58) Field of Classification Search ............... 375/145, 375/373; 370/342, 350, 509, 324, 507; 455/502, 455/561, 509
See application file for complete search history.

(56) References Cited

U.S. PATENT DOCUMENTS

| | | | |
|---|---|---|---|
| 2,470,787 A | 5/1949 | Nosker | 342/12 |
| 3,384,891 A | 5/1968 | Anderson | 343/100 |
| 3,544,995 A | 12/1970 | Bottenburg et al. | 343/6 |
| 4,161,730 A | 7/1979 | Anderson | 342/352 |
| 4,161,734 A | 7/1979 | Anderson | 342/352 |
| 4,359,733 A | 11/1982 | O'Neill | 343/6.5 |
| 4,613,864 A | 9/1986 | Hofgen | 343/357 |
| 4,819,227 A | 4/1989 | Rosen | 370/75 |
| 4,897,661 A | 1/1990 | Hiraiwa | 342/457 |
| 4,994,809 A | 2/1991 | Yung et al. | 342/108 |
| 5,006,855 A | 4/1991 | Braff | 342/357 |
| 5,099,245 A | 3/1992 | Sagey | 342/357 |
| 5,111,209 A | 5/1992 | Toriyama | 342/357 |
| 5,126,748 A | 6/1992 | Ames et al. | 342/353 |
| 5,233,626 A | 8/1993 | Ames | 375/1 |
| 5,278,863 A | 1/1994 | Briskman | 375/1 |
| 5,319,673 A | 6/1994 | Briskman | 375/1 |
| 5,387,916 A | 2/1995 | Cohn | 342/44 |
| 5,410,314 A | 4/1995 | Frush et al. | 342/26 |
| 5,444,450 A | 8/1995 | Olds et al. | 342/357 |
| 5,485,485 A | 1/1996 | Briskman et al. | 375/200 |
| 5,525,995 A | 6/1996 | Benner | 342/90 |
| 5,592,471 A | 1/1997 | Briskman | 455/52.3 |
| 5,644,572 A | 7/1997 | Olds et al. | 370/324 |
| 5,739,785 A | 4/1998 | Allison et al. | 342/357 |
| 5,864,579 A | 1/1999 | Briskman | 375/200 |

(Continued)

FOREIGN PATENT DOCUMENTS

EP   0 335 558   4/1989

(Continued)

OTHER PUBLICATIONS

U.S. Appl. No. 09/576,652, filed May 22, 2000, Hagen et al.

(Continued)

*Primary Examiner*—Amanda T. Le
*Assistant Examiner*—Lawrence B. Williams
(74) *Attorney, Agent, or Firm*—Georgann S. Grunebach

(57) ABSTRACT

A method for coherent phase synchronous CDMA communications between a gateway and multiple subscribers via multiple transponder platforms that includes the step of synchronizing a local reference clock for each subscriber in a service area to a single master reference clock for multiple transponder platforms wherein the distance separating the transponder platforms is constrained to a range wherein the local reference clocks for all subscribers have substantially the same phase with respect to the master reference clock.

15 Claims, 4 Drawing Sheets

U.S. PATENT DOCUMENTS

| | | | | |
|---|---|---|---|---|
| 5,875,402 | A | * | 2/1999 | Yamawaki .................. 455/502 |
| 5,899,957 | A | * | 5/1999 | Loomis ....................... 701/214 |
| 5,920,284 | A | | 7/1999 | Victor ..................... 342/357.01 |
| 5,944,770 | A | | 8/1999 | Enge et al. ................. 701/707 |
| 5,945,948 | A | | 8/1999 | Buford et al. .............. 342/457 |
| 5,949,766 | A | | 9/1999 | Ibanez-Meier et al. |
| 5,969,674 | A | | 10/1999 | Von Der Embse et al. ......... 342/357.16 |
| 6,138,012 | A | | 10/2000 | Krutz et al. ................ 455/427 |
| 6,151,308 | A | | 11/2000 | Ibanez-Meier et al. |
| 6,529,485 | B1 | * | 3/2003 | Agarwal et al. ............ 370/324 |
| 6,542,754 | B1 | * | 4/2003 | Sayers et al. ............... 455/502 |
| 6,633,590 | B1 | * | 10/2003 | Garofalo et al. ............ 370/507 |
| 6,665,316 | B1 | * | 12/2003 | Eidson ....................... 370/509 |
| 6,757,546 | B1 | * | 6/2004 | Hagen et al. ............... 455/502 |
| 2003/0083103 | A1 | * | 5/2003 | Drawert ...................... 455/561 |
| 2003/0231613 | A1 | * | 12/2003 | Bertrand et al. ............ 370/350 |
| 2004/0032883 | A1 | * | 2/2004 | Knapp et al. ............... 370/509 |

FOREIGN PATENT DOCUMENTS

| | | |
|---|---|---|
| GB | 2 271 902 A | 10/1993 |
| GB | 2 306 827 A | 5/1997 |
| JP | 2-28580 | 1/1990 |
| JP | 3-291584 | 12/1991 |
| JP | 4-27887 | 1/1992 |
| JP | 07146995 A | 6/1995 |
| JP | 08015405 A | 1/1996 |
| JP | 09026328 | 1/1997 |
| JP | 09113600 A | 5/1997 |
| JP | 10090391 A | 4/1998 |

OTHER PUBLICATIONS

U.S. Appl. No. 09/584,012, filed May 30, 2000, Chang et al.
U.S. Appl. No. 09/576,648, filed May 22, 2000, Yung et al.
U.S. Appl. No. 09/644,225, filed Aug. 21, 2000, Hagen et al.
U.S. Appl. No. 09/587,960, filed Jun. 6, 2000, Yung et al.
U.S. Appl. No. 09/587,759, filed Jun. 6, 2000, Yung et al.
U.S. Appl. No. 09/271,997, filed Mar. 18, 1999, Chang et al.
U.S. Appl. No. 09/209,062, filed Dec. 10, 1998, Yung et al.
U.S. Appl. No. 09/550,505, filed Apr. 17, 2000, Chang et al.
U.S. Appl. No. 08/803,937, filed Feb. 21, 1997, Chang et al.
U.S. Appl. No. 09/655,498, filed Sep. 5, 2000, Chang et al.
U.S. Appl. No. 09/735,861, filed Dec. 12, 2000, Feria et al.
U.S. Appl. No. 09/588,395, filed Jun. 6, 2000, Chang et al.
Teles J et al.: "Overview of TDRSS" Orbit Determination and Analysis. PSD Meeting, Cospar Technical Panel on Satellite Dynamics, 13$^{th}$ Cospar Scientific Assembly, Hamburg, Germany, Jul. 11-21, 1994, Advances in Space Research, pp. 67-76.
Bricker, P et al.: "Integrated Receiver for NASA Tracking and Data Relay Satellite System", MILCOM 90. A new Era, 1990 IEEE Military Communications Conference, Monterey, CA, USA, Sep. 30-Oct. 3, 1990, p. 1-5.
Dunham, J.B, et al.: "Onboard Orbit Estimation with Tracking and Data Relay Satellite System Data", Journal of Guidance, Control, and Dynamics, Jul.-Aug. 1983, USA, vol. 6 NR.4, pp. 292-301.
K. H. Bethke, "A Novel Noncooperative Near-Range Radar Network or Traffic Guidance and Control on Airport Surfaces", IEEE Transactions on Control Systems Technology, vol. 1, No. 3, Sep. 1993.
Doc 9524 FANS/4-WP/76, International Civil Aviation Organization, Special Committee on Future Air Navigation Systems, Fourth Meeting, Montreal, May 2-20, 1988, Report, pp. 3.2B-2 & 3.2B-3.
K. K. Chan, F. Marcoux, M. Forest, L. Martins-Camelo, "A Circularly Polarized Waveguide Array for Leo Satellite Communications", pp. 154-157, IEEE1999 AP-S International Symposium, Jun. 1999.
M. Oodo, R. Miura, Y. Hase, "Onboard DBF Antenna for Stratospheric Platform", pp. 125-128, IEEE Conference on Phased Array Systems and Technology, California, May 21-25, 2000.
Yokosuka Research Park, "The First Stratospheric Platform Systems Workshop", pp 1-216, May 12-13, 1999.

* cited by examiner

COHERENT PHASE SYNCHRONOUS CODE DIVISION MULTIPLE ACCESS COMMUNICATIONS FROM MULTIPLE TRANSPONDER PLATFORMS

BACKGROUND OF THE INVENTION

The present invention relates generally to code division multiple access (CDMA) communications systems. More specifically, but without limitation thereto, the present invention relates to a method for reducing the number of CDMA codes required for a group of subscribers serviced by multiple transponder platforms for synchronous CDMA communications.

Traditionally, when multiple satellites become available over a given geographic location, two or more nearby users may not use the same frequency spectrum or code space due to interference. Also, as the number of subscribers within a service area increases, the frequency bandwidth, the number of CDMA codes, or both must be increased to avoid interference from messages intended for other subscribers. The number of subscribers is therefore limited by the frequency bandwidth and the number of CDMA codes.

Methods for reducing the number of CDMA codes for a service area effectively increase the bandwidth of the frequency spectrum by making a greater portion of the bandwidth available for subscriber communication rather than for separating messages intended for different subscribers.

Although multiple transponder platforms such as satellites increase the system availability, their full potential has been unrealized because of the limit on the number of users imposed by the assigned frequency bandwidth and the number of available codes. In conventional asynchronous CDMA single satellite communication systems, unique CDMA codes are assigned to each user to ensure that information directed to one subscriber does not interfere with information directed to another subscriber. Similarly, in multiple satellite communication systems, when two or more satellites are serving in the same geographical location, unique CDMA codes within the same frequency bandwidth may be used to distinguish each subscriber. A problem with using the same CDMA code for multiple subscribers is that mutual interference prevents the proper decoding of information because the omnidirectional receiving antennas of the subscribers' terminals lack the capability to discriminate spatially among the satellites.

SUMMARY OF THE INVENTION

The present invention advantageously addresses the needs above as well as other needs by providing a method and apparatus for coherent phase synchronous CDMA communications between a gateway and multiple subscribers via multiple transponder platforms.

In one embodiment, the invention may be characterized as a method for coherent phase synchronous CDMA communications between a gateway and multiple subscribers via multiple transponder platforms that includes the step of synchronizing a local reference clock for each subscriber in a service area to a single master reference clock for multiple transponder platforms wherein the distance separating the transponder platforms is constrained to a range wherein the local reference clocks for all subscribers have substantially the same phase with respect to the master reference clock.

In another embodiment, the invention may be characterized as an apparatus for coherent phase synchronous CDMA communications between a gateway and multiple subscribers via multiple transponder platforms that includes a transmitter for transmitting forward link CDMA signals and a delayed synchronous CDMA message signal from a gateway to an intended subscriber via each transponder platform; a receiver for receiving return link CDMA signals at the gateway from the intended subscriber via each transponder platform; a propagation parameter calculator for calculating message signal propagation parameters from the return link CDMA signals; and a reference clock synchronizer for synchronizing a local reference clock of each subscriber to a master reference clock of the gateway from the calculated propagation parameters wherein the local reference clocks of all subscribers have substantially the same phase.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 1:
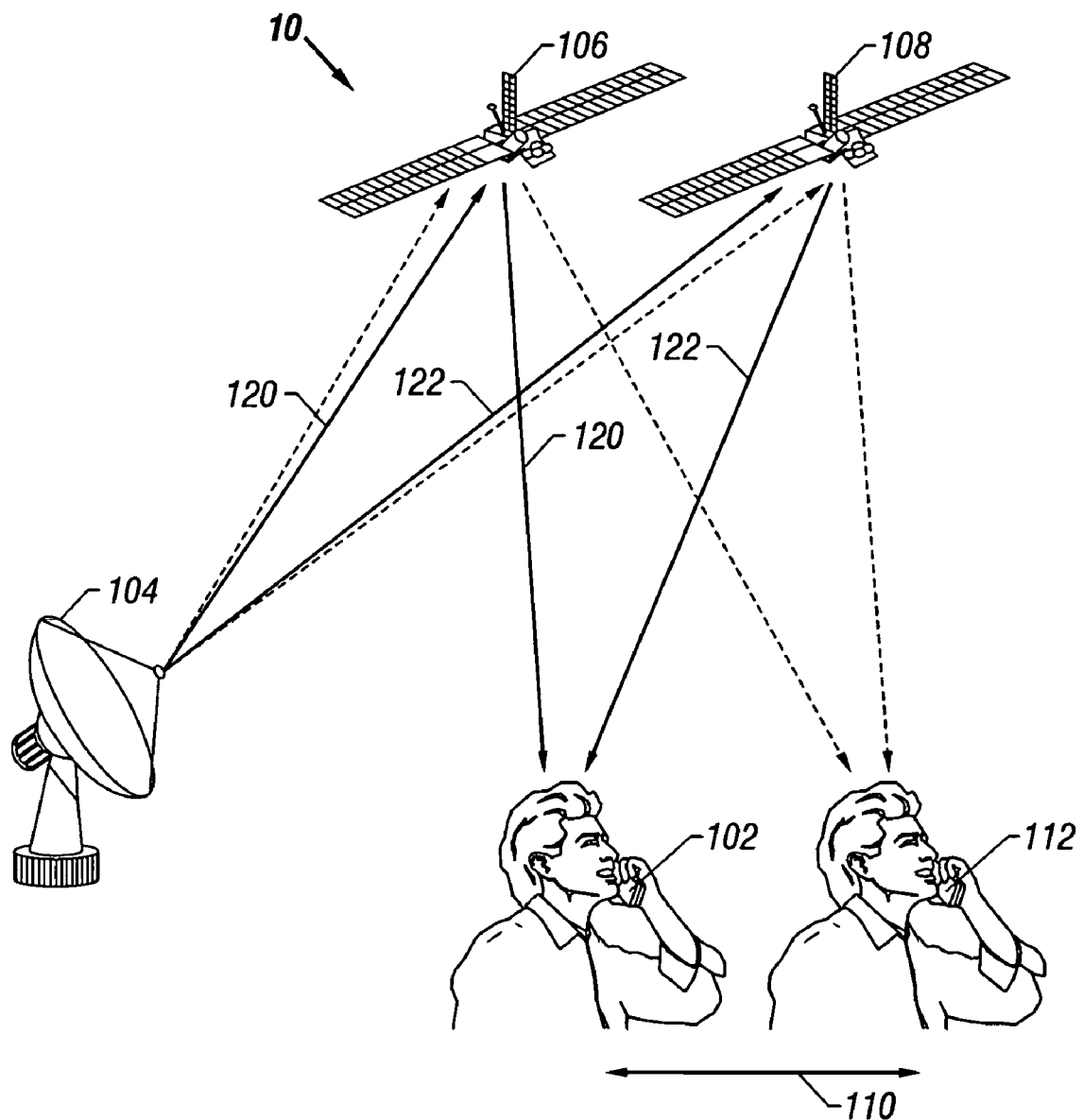
FIG. 1 is a diagram illustrating an exemplary multiple satellite communications system according to one embodiment of the present invention.

FIG. 1 is a diagram illustrating an exemplary multiple satellite communications system 10. In this example, single transponder satellites represent transponder platforms and cellular telephones represent subscribers. Alternatively, the transponder platforms may also be carrier signal frequency reflecting surfaces, and the subscribers may also be fixed or mobile terminals. Other suitable devices with sufficient field of view to cover the directions from which subscriber signals arrive and combinations thereof for relaying a signal from a gateway to a subscriber may also be used, whether fixed or mobile, on the ground, in the air, or in space. Similarly, subscribers may be any suitable devices and combinations thereof employed for CDMA communications, whether fixed or mobile, on the ground, airborne, or in space.

A first forward link CDMA signal 120 is transmitted by a hub or gateway 104 to a first satellite 106 and relayed from the first satellite 106 to an intended subscriber 102. A second forward link CDMA signal 122 is sent by the gateway 104 to a second satellite 108 and relayed from the second satellite 108 to the intended subscriber 102. The sequence of forward link CDMA signals may be sent at different times or otherwise arranged by well known techniques to avoid mutual interference. The subscriber 102 logs the time each forward link CDMA signal is received according to a local reference clock and inserts the time data in a return link CDMA signal corresponding to each forward link CDMA signal received.

Figure 2:
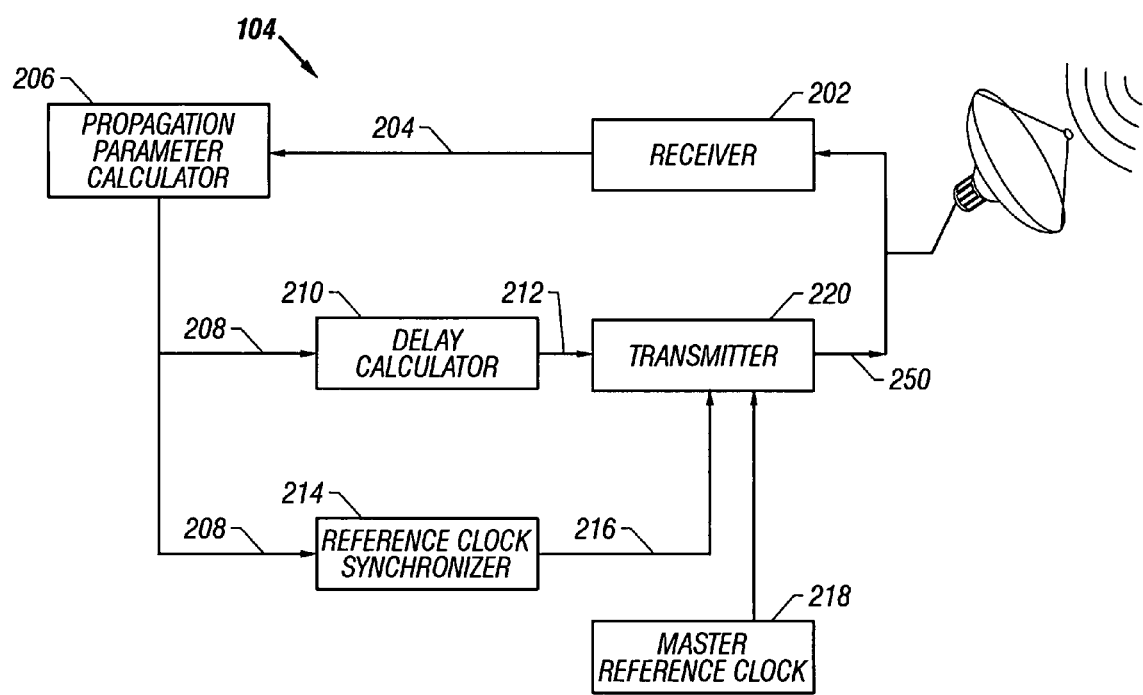
FIG. 2 is a block diagram of the gateway in FIG. 1 for coherent phase synchronous CDMA communications via multiple transponder platforms according to an embodiment of the present invention.

FIG. 2 is a block diagram of an exemplary gateway 104 in FIG. 1 for coherent phase synchronous CDMA communications via multiple transponder platforms. To simplify referencing in the figures, indicia are used interchangeably for signals and their connections. The reference 204 thus represents both the return link CDMA signals 204 from receiver 202 input by gateway 104 and the connection between receiver 202 and propagation parameter calculator 206. The propagation parameter calculator 206 calculates message signal propagation parameters 208 according to well known techniques from the return link CDMA signals 204 such as time delay, carrier frequency shift, and phase for each subscriber via each satellite. A delay calculator 210 inputs the calculated signal propagation parameters 208 and calculates respective delays 212 for each subscriber via each transponder platform.

A reference clock synchronizer 214 provides a reference clock correction 216 from the calculated signal propagation parameters 208 according to well known techniques for synchronizing the local reference clock of each subscriber to a master reference clock 218. To synchronize the message signals for all subscribers to the same reference clock for synchronous CDMA codes, the distance separating the satellites 106 and 108 is constrained by the method of the present embodiment as explained below so that the local reference clocks of all subscribers have substantially the same clock phase. This feature of synchronizing each local reference clock to the same master reference clock for all transponder platforms results in interfering messages having the same clock phase but not the same carrier phase as the message signal at the intended subscriber 102. Because all the CDMA signals have the same clock phase, they are synchronous, and the signal-to-noise ratio is substantially enhanced at the subscriber 102 by better rejection of interfering signals than is currently possible with asynchronous CDMA signals.

A transmitter 220 delays the message signal to the intended subscriber 102 by the respective delays 212 and transmits synchronous CDMA signals 250 from the gateway 104 to the intended subscriber 102 via each of satellites 106 and 108 so that message signals directed to the intended subscriber 102 arrive from the satellites 106 and 108 in coherent signal phase.

Figure 3:
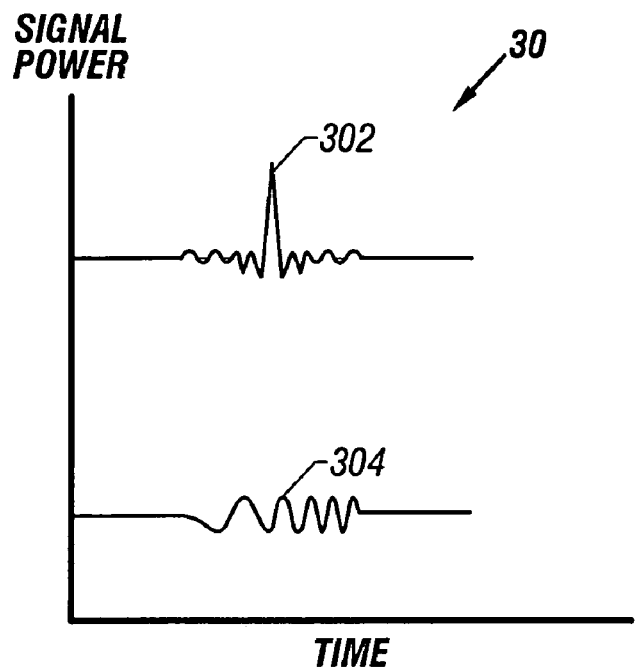
FIG. 3 is a diagram comparing matched filter outputs for multiple CDMA code sequences arriving at a subscriber in phase and out of phase for the example in FIG. 1.

FIG. 3 is a diagram comparing matched filter outputs 30 for multiple CDMA code sequences arriving at subscriber 102 in phase in plot 302 and out of phase in plot 304 for the example in FIG. 1. The in-phase signals add constructively at the intended subscriber 102's location, increasing the signal strength over that of a single transponder platform according to $$S = n_c c n_t^2 \qquad (1)$$

where S is the signal power, $n_c$ is the CDMA code length, and nt is the number of transponder platforms. On the other hand, the same CDMA code sequences arrive with different phases at unintended subscriber 112 and appear as interference noise according to $$N_I = n_c n_t \qquad (2)$$

where $N_I$ is the interference noise power. The signal-to-noise ratio for a typical subscriber is given by $$\frac{S}{N_I} = \frac{n_c n_t}{n_u - 1} \qquad (3)$$

where $n_u$ is the total number of users, i.e., subscribers.

Figure 4:
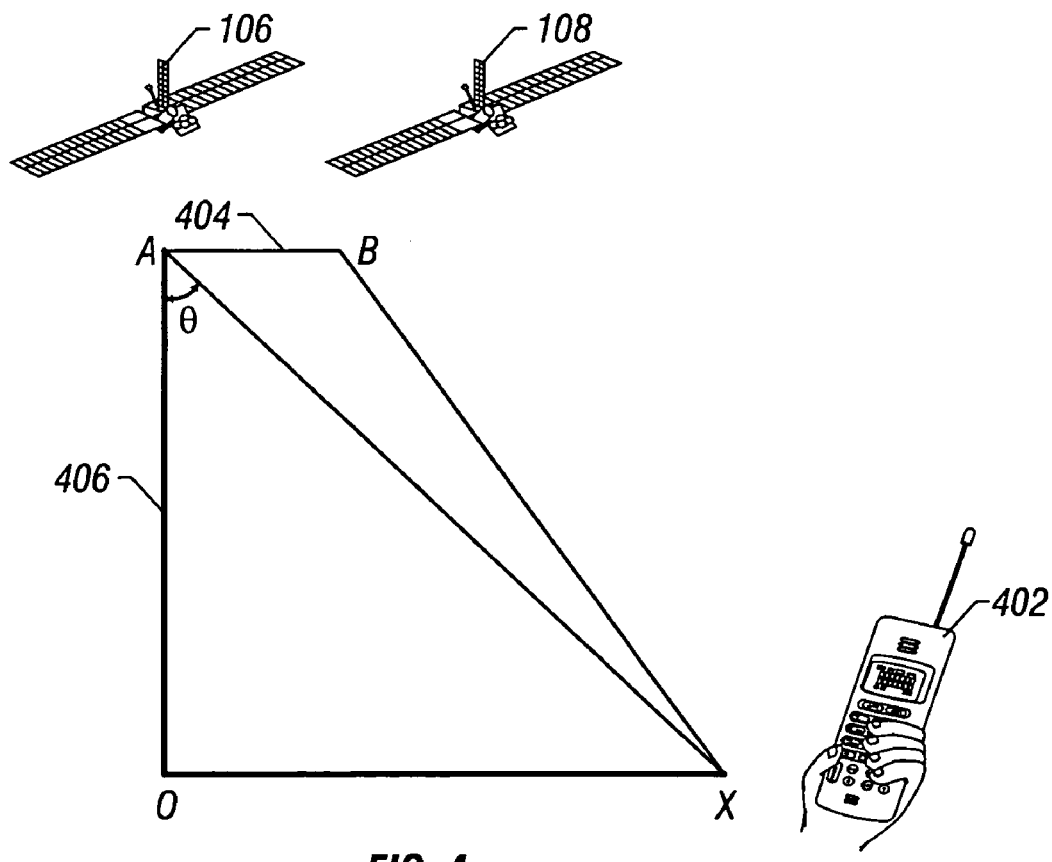
FIG. 4 is a diagram of the relationship between transponder platform separation and the angle of the subscriber from the transponder platform nadir for the example of FIG. 1.

FIG. 4 is a diagram of the relationship between transponder platform separation and the angle of the subscriber from the transponder platform nadir for the example of FIG. 1. To synchronize the message signals for all subscribers to the same reference clock for synchronous CDMA codes, satellites 106 and 108 are preferably within a distance from each other given by $$d \leq \frac{\Delta}{\sin\theta} \qquad (3)$$

where d is the separation 404 between transponder platforms 106 and 108, θ is the angle of a subscriber 402 at X relative to the transponder platform nadir 406 at O, and the tolerance Δ is a function of chip rate given approximately by $$\Delta \approx 0.1 \frac{c}{\text{chip rate}} \qquad (4)$$

where c is the speed of light. For a typical chip rate of 4 Mhz, $\Delta = 0.1 \times 3 \times 10^8 \text{ msec}^{-1}/4 \times 10^6 \text{ sec}^{-1} = 7.5$ m.

Figure 5:
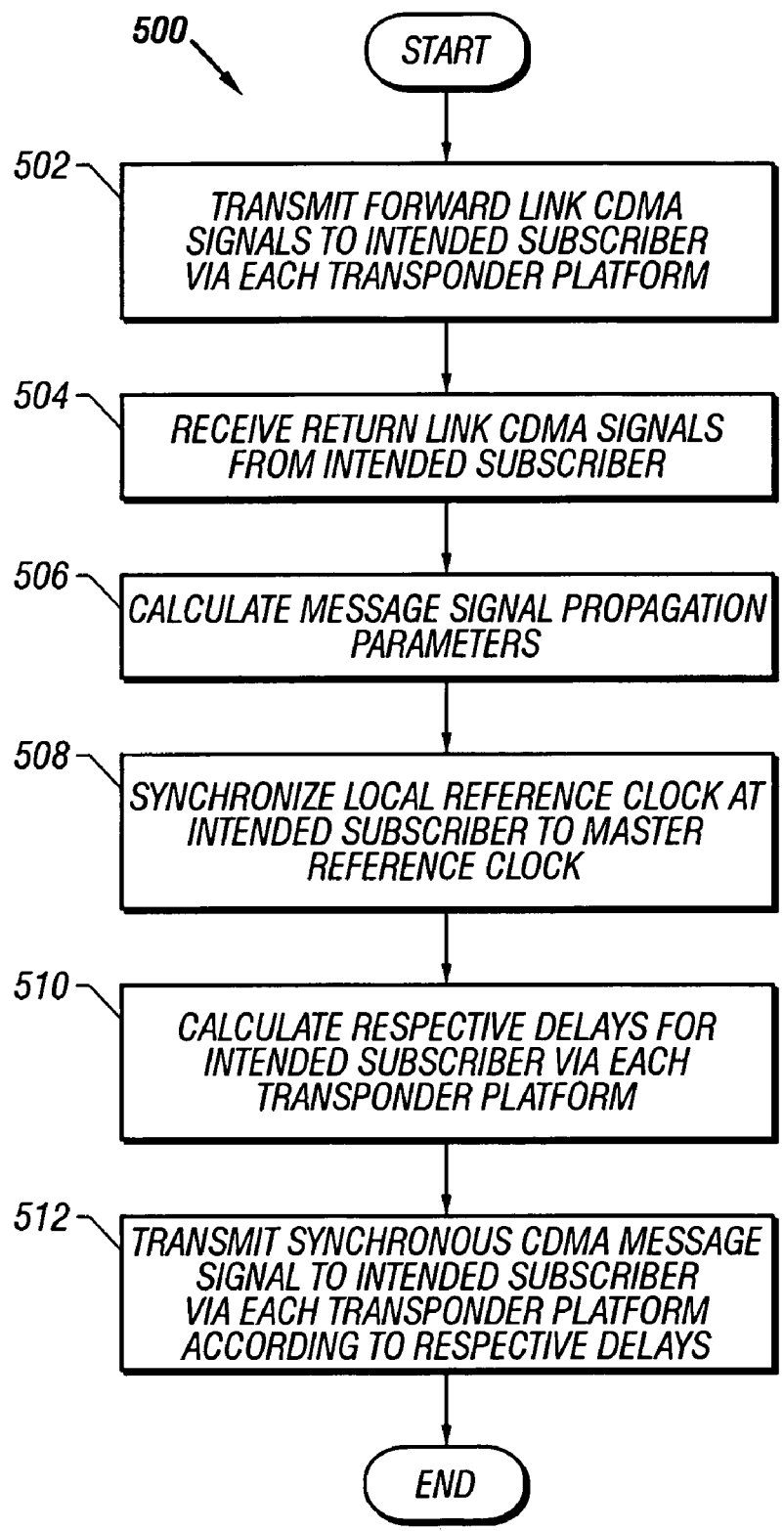
FIG. 5 is an exemplary flow chart for performing coherent CDMA signal reception according to another embodiment of the present invention.

FIG. 5 is an exemplary flow chart 500 for performing coherent phase synchronous CDMA communications from multiple transponder platforms according to another embodiment of the present invention. At step 502 forward link CDMA signals are transmitted from the gateway 104 to the intended subscriber 102 via each transponder platform. At step 504 the return link CDMA signals are received from the intended subscriber 102. At step 506 the message signal propagation parameters are calculated from the return link CDMA signals. At step 508 a local reference clock of each subscriber is synchronized to a master reference clock from the calculated propagation parameters so that all messages arrive at all subscribers having the same clock phase. At step 510 the respective delays are calculated for the intended subscriber 102 via each of the transponder platforms from the calculated signal propagation parameters. At step 512 a delayed synchronous CDMA message signal is transmitted from the gateway 104 to the intended subscriber 102 via each of the transponder platforms according to the respective delays so that the delayed message signals arrive having the same signal phase at the intended subscriber 102 and having different signal phases at unintended subscribers 112.

Other modifications, variations, and arrangements of the present invention may be made in accordance with the above teachings other than as specifically described to practice the invention within the spirit and scope defined by the following claims.

What is claimed is:

1. A method for coherent phase synchronous code division multiple access communications between a gateway and multiple subscribers via multiple transponder platforms comprising the step of synchronizing a local reference clock for each subscriber in a service area to a single master reference clock wherein the distance separating the transponder platforms is within a range and wherein the local reference clocks for all subscribers have substantially the same clock phase with respect to the master reference clock and transmitting delayed CDMA message signals from the gateway to an intended subscriber via each of the multiple transponder platforms with respective delays so that the intended subscriber receives the message signals with the same carrier signal phase and an unintended subscriber receives the message signals with different carrier signal phases.

2. The method of claim 1 further including the step of transmitting forward link CDMA signals from the gateway to an intended subscriber via each transponder platform.

3. The method of claim 2 further including the step of receiving return link CDMA signals at the gateway from the intended subscriber via each transponder platform.

4. The method of claim 3 further including the step of calculating message signal propagation parameters from the return link CDMA signals.

5. The method of claim 4 wherein the step of calculating message signal propagation parameters includes calculating a time delay between the time a message signal is transmitted from the gateway and the time the message signal is received by the intended subscriber.

6. The method of claim 4 wherein the step of calculating message signal propagation parameters includes calculating a frequency shift of the message signal relative to the intended subscriber.

7. The method of claim 4 wherein the step of calculating message signal propagation parameters includes calculating a phase shift of the message signal relative to the intended subscriber.

8. The method of claim 4 further including the step of calculating respective delays for the intended subscriber via each transponder platform from the calculated propagation parameters.

9. The method of claim 1 wherein the distance range separating the transponder platforms for synchronous CDMA communications substantially according to $$d \leq \frac{\Delta}{\sin\theta}$$

where d is the separation between transponder platforms, θ is the angle of the subscriber from a transponder platform nadir, and Δ is given approximately by $$\Delta \approx 0.1 \frac{c}{\text{chip rate}}$$

where c is the speed of light.

10. An apparatus for coherent phase synchronous code division multiple access communications between a gateway and multiple subscribers via multiple transponder platforms comprising;
    a transmitter for transmitting forward link CDMA signals and a delayed synchronous CDMA message signals from a gateway to an intended subscriber via each transponder platform;
    a receiver for receiving return link CDMA signals at the gateway from the intended subscriber via each transponder platform;
    a propagation parameter calculator for calculating message signal propagation parameters from the return link CDMA signals; and
    a reference clock synchronizer for synchronizing a local reference clock of each subscriber to a master reference clock of the gateway from the calculated propagation parameters wherein the local reference clocks of all subscribers have substantially the clock same phase,
    said transmitter transmitting the synchronous CDMA message signals to an intended subscriber via each of the multiple transponder platforms with respective delays so that an intended subscriber receives the messages with the same carrier signal phase and an unintended subscriber receives the message signals with different carrier signal phases.

11. The apparatus of claim 10 wherein the propagation parameter calculator calculates a time delay between the time a message signal is transmitted from the gateway and the time the message signal is received by the intended subscriber.

12. The apparatus of claim 10 wherein the propagation parameter calculator calculates a frequency shift of the message signal relative to the intended subscriber.

13. The apparatus of claim 10 wherein the propagation parameter calculator calculates a phase shift of the message signal relative to the intended subscriber.

14. The apparatus of claim 10 further comprising a delay calculator for calculating a respective delay for the intended subscriber via each transponder platform from the calculated propagation parameters.

15. The apparatus of claim 10 wherein the reference clock synchronizer synchronizes the local clocks when a distance d separating the transponder platforms is for synchronous CDMA communications is $$d \leq \frac{\Delta}{\sin\theta}$$

where d is the separation between transponder platforms, θ is the angle of the subscriber from a transponder platform nadir, and Δ is given approximately by $$\Delta \approx 0.1 \frac{c}{\text{chip rate}}$$

where c is the speed of light.

* * * * *